United States Patent [19]
Bronner et al.

[11] Patent Number: 5,250,829
[45] Date of Patent: Oct. 5, 1993

[54] DOUBLE WELL SUBSTRATE PLATE TRENCH DRAM CELL ARRAY

[75] Inventors: Gary B. Bronner, Mount Kisco; Sang H. Dhong, Mahopac; Wei Hwang, Armonk, all of N.Y.

[73] Assignee: International Business Machines Corporation, Armonk, N.Y.

[21] Appl. No.: 818,668

[22] Filed: Jan. 9, 1992

[51] Int. Cl.[5] .................. H01L 27/02; H01L 29/78; H01L 27/04
[52] U.S. Cl. .................. 257/301; 257/305; 257/549
[58] Field of Search ........... 257/301, 302, 303, 304, 257/305, 297, 548, 549

[56] References Cited

U.S. PATENT DOCUMENTS

| | | | |
|---|---|---|---|
| 4,688,063 | 8/1987 | Lu et al. | 257/304 |
| 4,794,434 | 12/1988 | Pelley | 257/301 |
| 4,801,988 | 1/1989 | Kenney | 257/304 |
| 4,829,017 | 5/1989 | Malhi | 437/47 |
| 4,873,560 | 10/1989 | Sunami et al. | 257/302 |
| 4,912,054 | 3/1990 | Tomassetti | 437/31 |
| 4,918,502 | 4/1990 | Kaga et al. | 257/304 |
| 4,944,682 | 7/1990 | Cronin et al. | 437/192 |
| 5,079,613 | 1/1992 | Sawada et al. | 257/544 |

FOREIGN PATENT DOCUMENTS 0283964 9/1988 European Pat. Off. .
2215913 9/1989 United Kingdom .

OTHER PUBLICATIONS

"Trench and Compact Structures for DRAMs" by P. Chatterjee et al, International Electron Devices Meeting 1986, Technical Digest paper 6.1, pp. 128-131.

"CMOS Semiconductor Memory Structural Modification to Allow Increased Memory Charge" Anonymous, IBM Technical Disclosure Bulletin, vol. 31, No. 11, Apr. 1989, pp. 162-165.

"A 45-ns 16Mb DRAM with Triple-Well Structure" by S. Fujii et al, IEEE Journal of Solid-State Circuits, vol. 24, No. 5, Oct. 1989, pp. 1170-1175.

"New Well Structure for Deep Sub-micron CMOS/BiCMOS Using Thin Epitaxy over Buried Layer and Trench Isolation" by Y. Okazaki et al, 1990 Symposium on VLSI Technology, Digest of Technical Papers, paper 6C-4, pp. 83-84.

*Primary Examiner*—Rolf Hille
*Assistant Examiner*—Robert Limanek
*Attorney, Agent, or Firm*—Howard J. Walter, Jr.

[57] ABSTRACT

A high density substrate plate DRAM cell memory device and process are described in which a buried well region is formed adjacent to deep trench capacitors such that the substrate region of DRAM transfer FETs can be electrically isolated from other FETs on a semiconductor substrate. The buried region is partially formed by ion implantation and diffusion to intersect the walls of the deep trenches.

5 Claims, 5 Drawing Sheets

DOUBLE WELL SUBSTRATE PLATE TRENCH DRAM CELL ARRAY

RELATED APPLICATIONS

This application is related to co-pending application Ser. Nos. 07/819,159 and 07/819,148 filed concurrently herewith and entitled "Double Grid Substrate Plate Trench DRAM Cell Array" by J. Park et al. and "Diffused Buried Plate Trench DRAM Cell Array" by D. M. Kenney, respectively.

BACKGROUND OF THE INVENTION

1. Field of the Invention

This invention relates to semiconductor memory devices and particularly to high density dynamic random access memory cells and methods for their manufacture in sub-micron technologies.

2. Description of the Prior Art

Designers of technologies for producing semiconductor devices have been continually pressured to increase effective device densities in order to remain cost and performance competitive. As a result, VLSI and ULSI technologies have entered the sub-micron realm of structural dimensions and now are designing technologies in the deep submicron feature size range. In the foreseeable future absolute atomic physical limits will be reached in conventional two-dimensional design approach to semiconductor device design. Traditionally, Dynamic Random Access Memory (DRAM) designers have met the severest of challenges in advancing technologies by pushing the limits of feature size resolution with each generation of DRAM. For example, designers of 64K bit DRAMs were perplexed to learn that a practical physical limit to charge capacity of storage capacitors for planar cell layouts had already been reached due to the minimum charge capacity required to allow reliable data signal sensing in the presence of naturally occurring atomic particle radiation inherently present in fabrication materials and the operating environment. Storage capacitors in the range of about 50 femtofarads were considered to be a physical limit. From a practical view, this limitation prevented a continuation of the scaling of DRAM dimensions and voltages initiated in the early 1980s. Reduction in the surface area of semiconductor substrate utilized by the DRAM storage capacitor has been severely restricted. Due to deceases in the thickness of reliable capacitor dielectric materials, existing 1 Megabit (1 Mb) DRAM technologies continue to enjoy the freedom of planar, two-dimensional device and circuit design. Beginning with 4 Mb DRAMs, the world of three-dimensional design has been utilized to the extent that the simple single device/capacitor memory cell has been altered to provide the capacitor in a vertical dimension. In such designs, the capacitor has been formed in a trench formed in the surface of the semiconductor substrate. In yet denser designs, other forms of three-dimensional capacitors have been proposed, such as stacking the plates of the capacitor above the transfer device. Such designs, however, present difficulties in forming the interconnections to the required word access and data bit lines to the DRAM memory cell. Additional designs have been proposed in which the transfer device and its associated capacitor are both formed within a trench of preferably minimum feature size. Currently, insurmountable processing difficulties make such designs impractical for product manufacturing processes.

A large number of proposals for 16 Mb and greater density DRAM cell designs have avoided continuing development of trench cell technology because of the existence of charge leakage mechanisms known to be present in trench capacitor structures. As these leakage mechanisms have become known, extensions of trench DRAM cells designs have been used successfully in 16 Mb designs.

The following references describe various aspects of prior art techniques used in DRAM and other semiconductor technologies.

The article "Trench and Compact Structures for DRAMs" by P. Chatterjee et al., International Electron Devices Meeting 1986, Technical Digest paper 6.1, pp. 128-131, describes variations in trench cell designs through 16 Mb DRAM designs, including the Substrate Plate Trench (SPT) cell described in more detail in U.S. Pat. No. 4,688,063 issued Aug. 18, 1987 to Lu et al. and assigned to the assignee of the instant invention. The SPT cell uses a highly conductive substrate as the DRAM cell plate. The storage node of each cell is formed in a deep trench in the substrate. U.S. Pat. No. 4,801,988 issued Jan. 31, 1989 to Kenney and assigned to the assignee of the instant invention, describes an improved SPT cell which includes a thick isolation region formed within the trench to enable higher density packing of DRAM cells. The article "CMOS Semiconductor Memory Structural Modification to Allow Increased Memory Charge" anonymous, IBM Technical Disclosure Bulletin, Vol. 31, No. 11, April 1989, pp. 162-5, teaches a method of isolating the substrate plate of an SPT cell from support devices by providing a buried region under support devices in order to allow the plate reference voltage to be separately biased at an optimum Vdd/2 volts.

U.S. Pat. No. 4,912,054 issued Mar. 27, 1990 to Tomassetti describes methods of isolating bipolar-CMOS circuit devices through the use of various epitaxial layers as commonly found in bipolar device technologies. The article "A 45-ns 16-Mbit DRAM with Triple-Well Structure" by S. Fujii et al., IEEE Journal of Solid-State Circuits, Vol. 24, No. 5, October 1989, pp. 1170-1175, describes techniques for isolating various different functional device types in which the entire array of trench DRAM cells is formed within a surface implanted P-well.

U.S. Pat. No. 4,829,017 issued May 9, 1989 to Malhi describes a method of forming a buried doped layer in a substrate by forming a shallow trench, protecting its sidewalls, further extending the trench and finally doping the walls of the extended trench to form a continuous doped region useful as the storage node of a trench DRAM.

The article "New Well Structure for Deep Submicron CMOS/BiCMOS Using Thin Epitaxy over Buried Layer and Trench Isolation" by Y. Okazaki et al., 1990 Symposium on VLSI Technology, Digest of Technical Papers, paper 6C-4, pp. 83-4, describes the use of buried epitaxial layers to isolate surface devices from the substrate.

The following references relate specifically to variations in SPT DRAM cells in which a buried region of opposite conductivity type from the substrate is used a one plate of the DRAM storage capacitor. U.S. Pat. No. 4,918,502 issued Apr. 17, 1990 to Kaga et al. describes a buried plate trench DRAM cell in which the storage node of the cell and a sheath plate are formed in a single trench. At the bottom of the trench a diffusion of opposite type from the substrate is formed such that the diffusions of adjacent cells interconnect forming a grid-like structure. One or more trenches not associated with a DRAM cell is formed to act as a reach through to enable the doped region to be biased at a suitable reference voltage. FIG. 12, thereof, clearly illustrates the grid-like aspect of the buried region. European published application 0 283 964, published Sep. 28, 1988 describes a buried plate SPT DRAM cell in which an out-diffused region from the DRAM trenches, similar to that in Kaga et al., in which the diffused region forms the plate of the SPT cell. As in Kaga et al. a grid-like region is formed and is contacted by a non-cell trench. U.S. Pat. No. 4,873,560 issued Oct. 10, 1989 to Sunami et al, describes yet another buried plate SPT cell in which the access transistor is formed in the cell trench. FIG. 30, thereof, and its related text, describes the importance of maintaining the grid-like structure of the buried region in order to enable proper operation of the cell transfer device. Sunami et al, further cautions that in the event that opening in the grid-like buried region should be "filled by the depletion layer" isolating the surface devices from the substrate a separate connection can be made to the "isolated" surface region in order to bias it to the same potential as the substrate. UK Patent Application GB 2 215 913 A, published Sep. 27, 1989 describes yet another variation in the buried SPT DRAM cell design in which the dopant for the buried region is provided b ion implantation into the sidewalls of the deep trench of the DRAM cell. Finally, U.S. Pat. No. 4,794,434 issued Dec. 27, 1988 to Pelley, describes a buried plate SPT DRAM cell formed using bipolar device processing methods in which the buried plate region is formed from a buried sub-collector structure normally part of a bipolar transistor.

While the above cited references illustrate the diverse and concentrated efforts made by DRAM designers in attempting to overcome the inherent barriers in continuing to reduce the size, and increase the density, of DRAM cells, none provide the capability to carry DRAM technology into the sub-0.5 micron feature size range, a feat which must be achieved in order to continue the two decade "tradition" of providing ever increasing density of DRAM technology. DRAM designers have turned to the process-complicating use of "stacked capacitor" DRAM cells knowing that the addition of processing steps decreases the manufacturability of a specific design.

Referring to FIG. 1, there is shown a schematic cross-sectional view of the basic Substrate Plate Trench (SPT) DRAM cell described in U.S. Pat. No. 4,688,063 to Lu et al. entitled "Dynamic RAM Cell with MOS Trench Capacitor in CMOS". A P+ type semiconductor substrate 10 is provided with a lightly doped epitaxial surface layer 11 in which is provided N-type retrograde implanted well 12 formed at its upper surface in which the transfer device 14 is formed. A control gate electrode 16 is responsive to signals from word line circuitry to couple data signals applied to the bit or data line diffused region 18 to the diffused storage node region 20. A deep trench 22 is provided in which a storage capacitor is formed. A polysilicon storage node plate 24 is formed in the trench and isolated from the substrate 10 by a thin storage node dielectric, not shown. A conductive strap 26 connects the diffused node 20 to the plate 24.

Manufacturing experience has shown that the SPT DRAM cell described is not suitable for extension to greater than 16 Mbit applications due in part to the performance limitations of P-array transfer devices and the existence of a parasitic device formed by the diffused storage node 20, the polysilicon plate 24 and the substrate 10. Simple conversion to N-type transfer devices is not practical and reduction of electrical stress on the capacitor dielectric by using Vdd/2 reference node biasing is not possible. The subject invention addresses the unsolved problems of the prior art by providing a solution to barriers presented in extending the manufacturability of the simple SPT cell to 64 Mb DRAM and beyond.

SUMMARY OF THE INVENTION

An object of the invention is to provide a double diffused SPT DRAM cell in which the density limitations of the prior art are removed.

Another object of the the invention is to provide a Substrate Plate Trench DRAM design which does not increase process complexity at the expense of product yield.

Yet another object of the invention is to provide an SPT DRAM cell which has a minimum impact on existing processing technologies.

The present invention relates to methods for providing a cell design in which all of the historically limiting parameters of DRAM cells are dealt with in a unifying manner to provide a near optimum design in which charge leakage factors are minimized and device bias conditions are optimized. The invention includes a substrate plate trench DRAM cell array in which a double well structure is formed as part of an electrically and physically isolated region in a semiconductor substrate such that the cell transfer device can be operated independently from other support devices formed in the substrate. The invention utilizes a double well structure which isolates the N-array devices within a separate P-well inside of an N-well without addition of masks over those used to fabricate a conventional SPT DRAM cell.

These and other objects and features of the invention will become more fully apparent from the several drawings and description of the preferred embodiment.

DESCRIPTION OF THE PREFERRED EMBODIMENT

Figure 1:
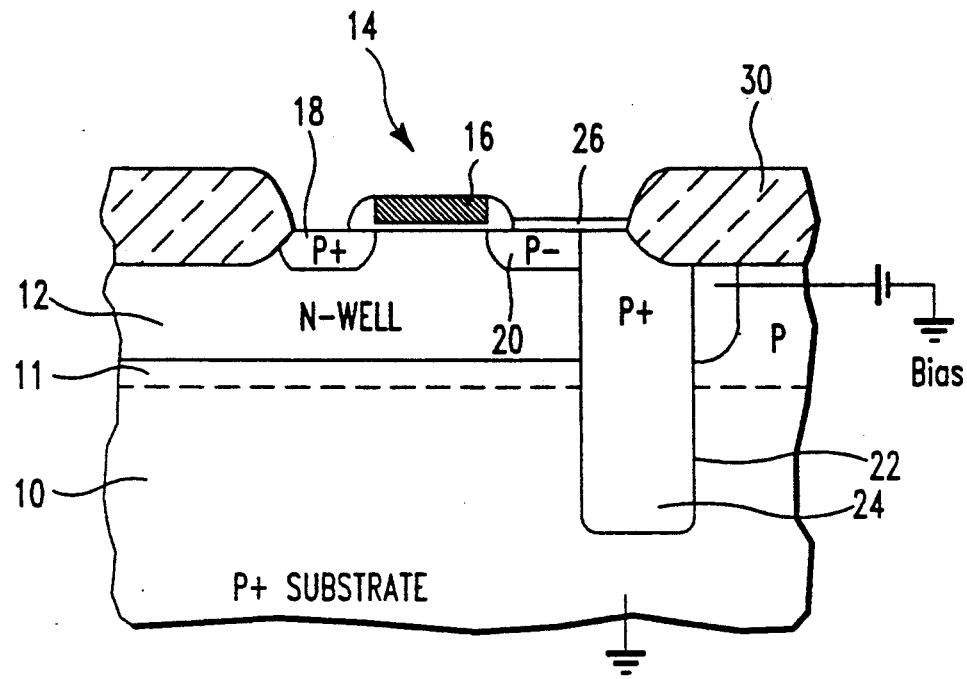
FIG. 1 is a simplified schematic sectional view of a substrate plate trench (SPT) DRAM cell of the prior art illustrating the basic electrical connections of the cell.
Figure 2:
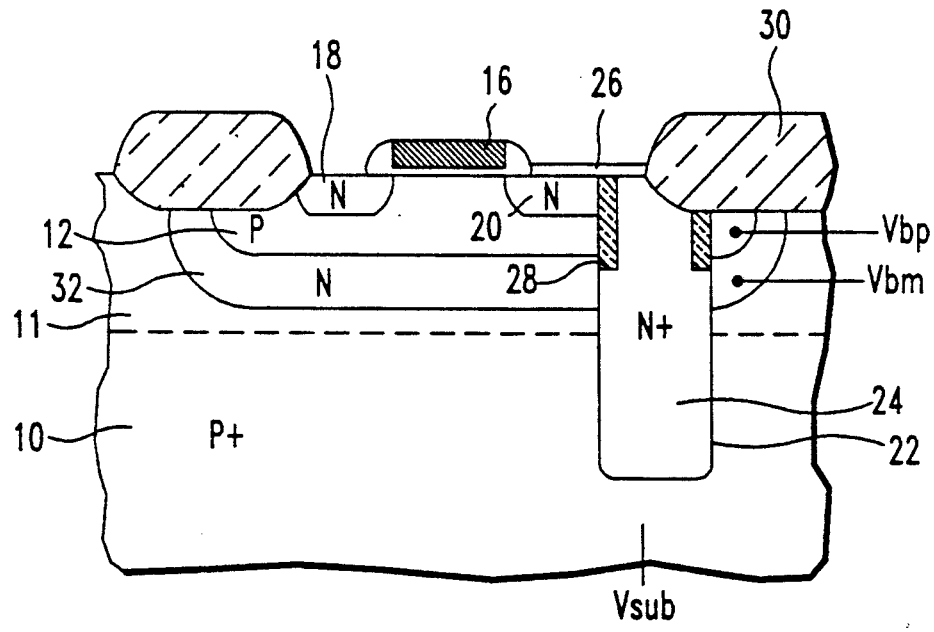
FIG. 2 is a simplified schematic sectional view of the double well substrate plate trench (SPT) DRAM cell of the invention illustrating the basic electrical connections of the cell.

Referring to FIG. 2, there is shown the basic elements of the double well Substrate Plate Trench DRAM cell of the invention. The cell is an improvement of the prior art SPT DRAM cell as described by Lu et al. in U.S. Pat. No. 4,688,063 and as modified by Kenney in U.S. Pat. No. 4,801,988, both of which are incorporated herein by reference. The cell includes the following major features. A substrate 10 of P+ type semiconductor material have an upper epitaxial layer of P- type material, as in the prior art. A P-type well 12 is formed at its upper surface into which N-channel transfer devices 14 are formed. A control gate electrode 16 of device 14 is responsive to a word access line of the DRAM array support circuits, not shown, to couple data between data or bit line diffused N-type region 18 and diffused N-type storage node region 20 through the channel region formed in P-well 12. In a manner similar to the prior art, a storage capacitor is formed in a deep trench 22 adjacent to the storage node 20 and includes a signal storage node formed by conductive N-type polysilicon electrode 24 isolated from substrate 10 by a thin dielectric layer. Diffused surface storage node 20 and signal storage node 24 in the trench 22 are connected by a conductive strap 26. At the top of the storage trench a thick insulating collar 28 is provided to increase the threshold voltage of the vertical parasitic FET formed by the diffused storage node 20 and the substrate within the P-well 12. To eliminate the trench gate-induced diode leakage mechanism, the collar 28 must extend below the N-well 32. Local surface isolation 30 is also provided, as is well known in the prior art.

It will be recognized that the cell features just described, with the exception of the substrate type, are similar to the N-channel variant of the prior art SPT DRAM cell. However, a second well or buried region 32 of N-type impurity type is additionally provided to provide physical and electrical isolation to enable the independent biasing of the reference voltage node for the trench capacitor. Unlike prior art substrate plate trench DRAM cells, the buried region 32 of the invention forms an electrical and physical isolation means between the surface well 12 in which the transfer devices are formed and the semiconductor substrate 10 in which one or more DRAM cell arrays and support circuits are formed. Thus, buried region 32 and its two p-n junctions provide a means to independently bias, by way of Vsub, not only the plate reference voltage of the cells, but also the local substrates of both N-and P-channel devices used in support devices and the transfer devices 14 of the DRAM cells. It will be recognized that the buried layer voltage can be biased by Vbn to provide optimum isolation between the buried reference electrode and the P-well in which the active devices are to be formed.

It is an important aspect of the invention to provide arrays of cells as described in connection with FIG. 2 in a simple easy to manufacture processing sequence. Because the basic SPT cell is placed inside a P-well which is contained in an N-well, the additional processing steps necessary to fabricate the invention are minimized. To prevent prevent gated-diode leakage due to the trench cutting through the wells, a dielectric collar 28 is placed around the top of the deep trenches. Typically, the P-well can be biased at about −1 volt, the P+ substrate 10 at a level between ground and Vdd and the N-well 32 at a potential greater than or equal to the substrate potential Vsub. If one chooses to fabricate N-channel support FETs directly in the surface of the epitaxial layer 11, then a Vsub of 0 volts is advantageous. Additional advantages over the prior SPT cells which might not be readily apparent include the use of N-channel transfer devices providing faster I/O operations of the DRAM cell, providing isolation of all of the array transfer devices by the double pn junctions between regions 12 and 32 and 32 and 11 and enabling the substrate to be biased to reduce the stress across the storage node dielectric.

Reference is now made to FIGS. 3–10 which describe the preferred process sequence used to fabricate the double well substrate trench DRAM cell array.

Figure 3:
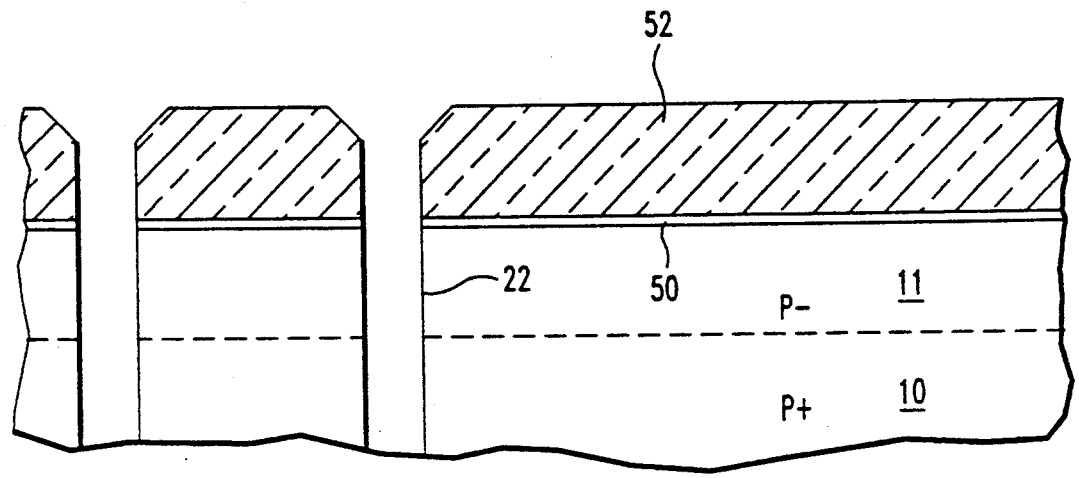
FIGS. 3-10 are schematic sectional views of the array of the invention illustrating the array at various steps in a preferred manufacturing process.

Referring to FIG. 3, starting with a heavily doped P+ type semiconductor wafer 10, having a lightly doped p- epitaxial layer 11 on its upper surface, an oxide/nitride layer 50 having a thickness of about 175 nm is formed on substrate 10 to act as an etch/polish stop to be used in subsequent steps. A relatively thick, about 500 nm, layer 52 of oxide is deposited by a conventional CVD TEOS technique to act as an etch mask for trenches 22. A photolithographic mask is formed using a high resolution photoresist and is used to define the pattern of trenches 22 which are to be etched in substrate 10. The mask pattern is transferred to the thick oxide layer 52 and the oxide/nitride layer 50 by a dry plasma etching process using oxygen and carbon tetrafluoride (CF4) as the active agents. After stripping the photoresist, trenches 22' are etched to a depth of about 5.0 microns using a anisotropic RIE process to provide the structure shown in FIG. 3. It should be noted that the bottom of the etched trenches are not shown as a matter of convenience in describing the invention.

Figure 4:
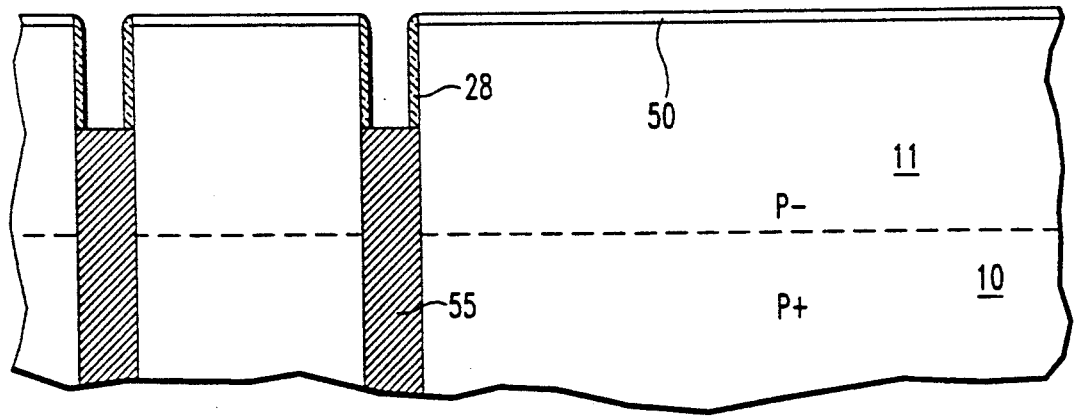

Next, as shown in FIG. 4, the trench capacitor structure is formed by thermally oxidizing the now exposed silicon sidewalls and bottom of the trenches to a thickness of about 4 nm. Then, about 7 nm of silicon nitride is conformally deposited. The nitride layer is then oxidized to form about 1.5 nm silicon dioxide to complete the ONO cell node dielectric. The trenches are then filled by conformally depositing polysilicon doped to at least 1E19 atoms/cubic centimeter to a thickness of about 900 nm above the surface of the substrate. A thermal anneal step at about 1000 degrees C. in nitrogen heals any inadvertent seams formed in the polysilicon in the deep trenches 22. A polysilicon RIE process selective to silicon dioxide and silicon nitride then removes all of the polysilicon on the planar areas of the substrate and etches into the polysilicon at the tops of the trenches to a level of about 1 micron below the surface of the substrate leaving doped polysilicon 55 in the bottom of the trenches. The trench collar 28 is then formed on the sidewalls of the exposed trench tops by conformally depositing a layer of about 90 nm of CVD silicon dioxide and then anisotropically etching the oxide from planar areas, including the bottoms of the trenches, to leave a collar 28 on the upper sidewalls of the recessed trenches in a manner similar to that in U.S. Pat. No. 4,801,988. The resulting structure is shown in FIG. 4.

Figure 5:
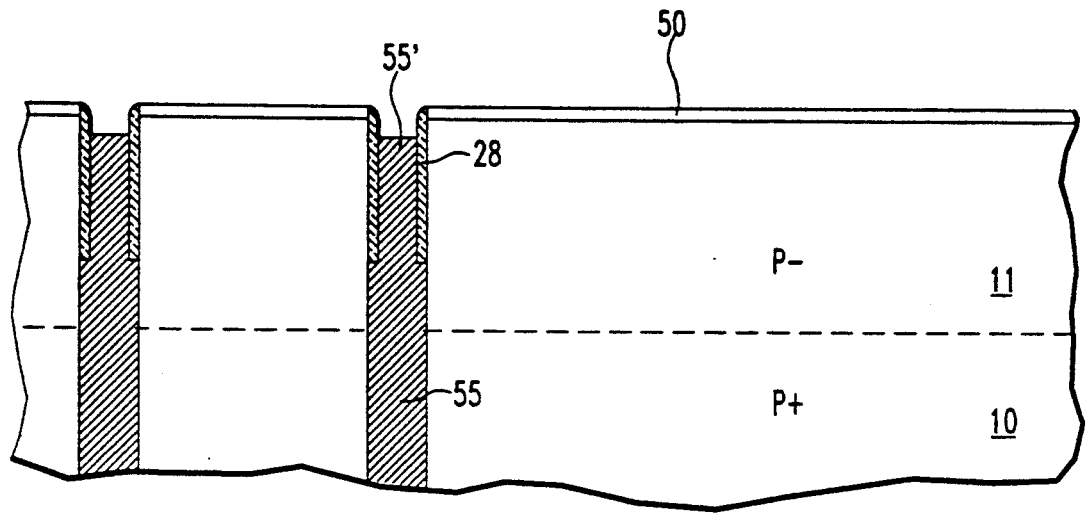

Referring now to FIG. 5, the trenches are again filled with arsenic doped polysilicon to a surface thickness of about 600 nm and annealed, as above. Then all of the thus deposited polysilicon formed on the back side of the substrate is removed preferably by a planarizing process such as chemical-mechanical polishing in order to reduce any undesirable stress caused by this non-functional layer. The front, or trench containing side, of the substrate is then planarized to remove the last deposited 600 nm of polysilicon from all planar surfaces. In order to achieve superior planarity, it is preferable to use a chemical-mechanical polishing technique. Such techniques are described in greater detail in U.S. Pat. No. 4,994,836 to Beyer et al. and U.S. Pat. No. 4,789,648 to Chow et al. Next, polysilicon 55' in the top of the trenches is recessed about 50 nm to 100 nm below the substrate surface in order to prevent subsequently applied polysilicon word lines from shorting to the signal storage node of the trench capacitors. The resulting structure is shown in FIG. 5.

Figure 6:
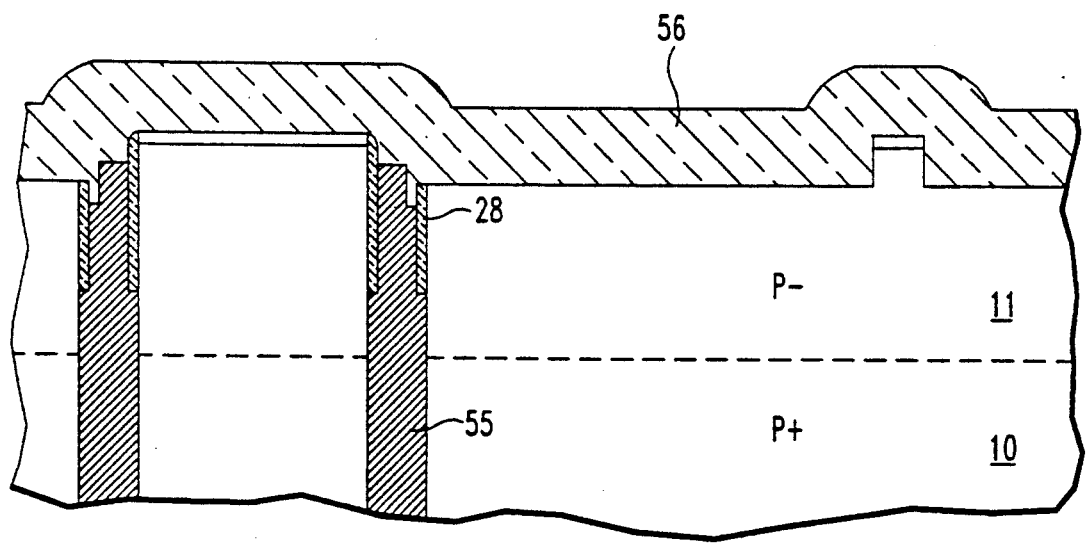

Next the local isolation in the form of shallow trench isolation (STI) is formed, shown in FIG. 6. An STI mask is applied to the substrate and defines all of the regions where STI is desired. The exposed oxide/nitride etch stop layer 50 is etched to expose the silicon substrate surface and overlapped polysilicon filled trench tops. Preferably in the same processing chamber, the exposed substrate, trench collar and polysilicon are etched to a depth of about 350 nm. A LPCVD TEOS oxide layer 56 of about 630 nm is then conformally deposited over the entire substrate as shown in FIG. 6.

Figure 7:
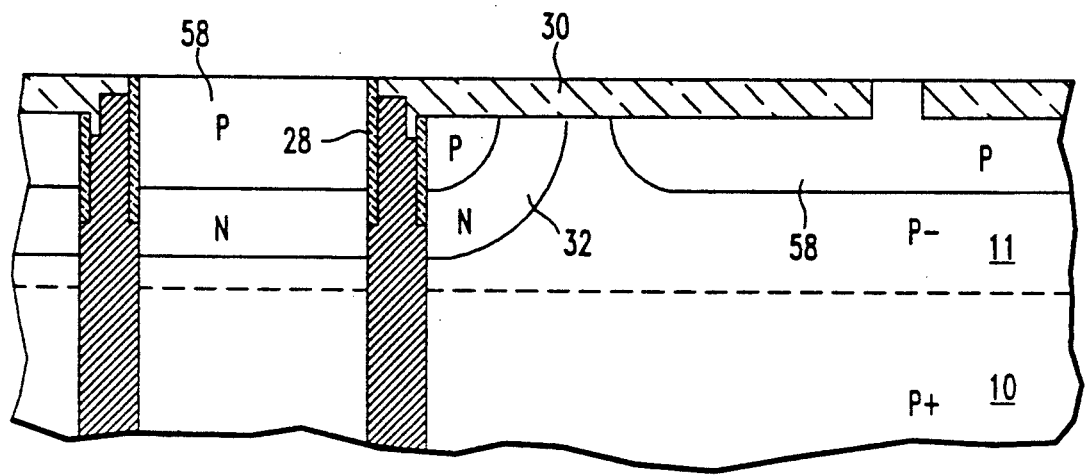

Next, as shown in FIG. 7, STI oxide layer 56 is planarized, preferably by a combination of RIE etch-back and chemical-mechanical polishing as described in co-pending application Ser. No. 07/427,153 filed Oct. 25, 1989 entitled "Forming Wide Dielectric Filled Trenches in Semiconductors" by Kerbaugh et al. Next, any remaining oxide/nitride layer 50 is removed by hot phosphoric acid and buffered HF. At this point, a sacrificial oxide may be grown on the exposed substrate surfaces, as these will become the active device areas for N- and P-channel devices of the CMOS process into which the array of the invention is integrated.

Next, N-wells for P-channel devices and for providing the buried N-type well region 32 are formed by the conventional use of an N-well mask which covers all of the substrate except where N-wells are desired. After formation of the N-well mask, the substrate is exposed to a plurality of ion implantation steps to form retrograde N-wells 32. Phosphorus ions are implanted at about 900 KEV with a dose of about 5E13 atoms per square centimeter to form the higher concentration deepest portion of the well, at about 500 KEV with a dose of about 2.3E13 atoms per square centimeter to form the bulk of the well, and at about 150 KEV with a dose of about 1.9E12 atoms per square centimeter to control punch through. If desired an additional N-well mask can be used at this point to selectively implant arsenic at about 80 KEV with a dose of about 1.3E12 atoms per square centimeter to control the threshold voltage of the P-channel FETs formed in selective N-wells. Additional implant masks and implants may also be used to further tailor specific device threshold voltages.

Following the formation of the N-wells, a conventional P-well mask is formed in a similar manner in order to mask the substrate against boron ions used to form the P-wells 58, also shown in FIG. 7. To form the P-wells, boron ions are implanted at about 200 KEV with a dose of about 8E12 atoms per square centimeter to form the bulk of the well, at about 80 KEV with a dose of about 1.6E12 atoms per square centimeter to control punch through region and at about 7.3 KEV with a dose of about 3.7E12 atoms to control the threshold voltage of the N-channel FETs used in the array and support circuitry of the DRAM. Thus, the structure in FIG. 7 results. It will be clear from the above description, that the N-well regions 32 make physical contact with the substrate epitaxial layer 11 and the P-wells 58 in order to physically and electrically isolate the P-region 58 and 11, including P+ substrate 10. Unlike the prior art, there is no need to ensure that the substrate regions of the transfer devices can be electrically coupled to the semiconductor substrate 10.

Figure 8:
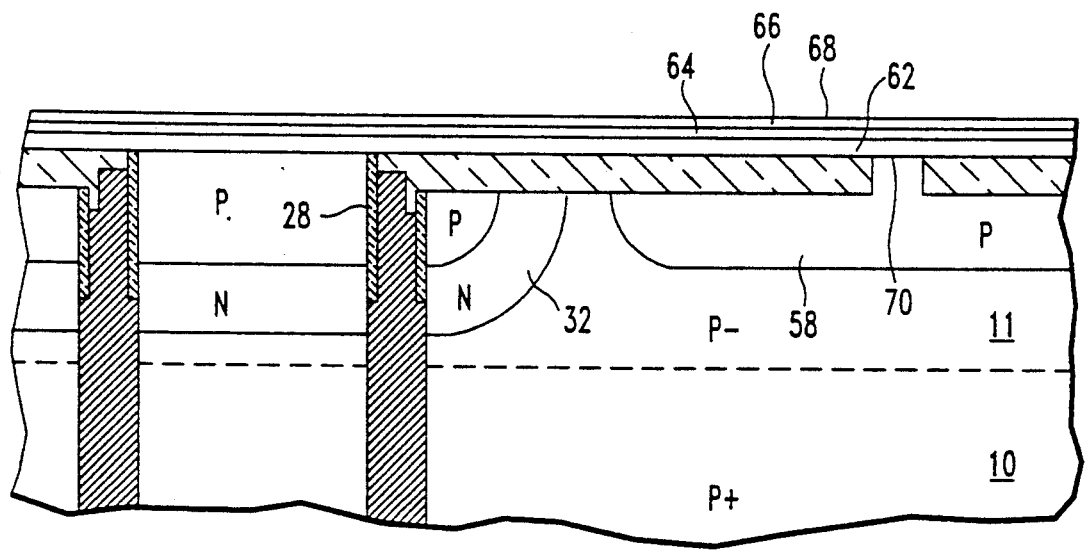

Next, the gate stack structure comprising the gate insulator, a conductive gate and a silicon nitride cap is formed as shown in FIG. 8. After stripping the sacrificial oxide referred to above, a gate insulator layer 60 is formed by growing about 10 nm of silicon dioxide on the exposed silicon surfaces of the substrate. A polysilicon layer 62 of about 200 nm is deposited and doped by ion implanting phosphorus at about 25 KEV with a dose of about 6E15 atoms per square centimeter. This is followed by deposition of about 100 nm of titanium silicide layer 64 by sputtering to reduce the resistivity of the wordlines. The gate stack is completed by depositing a layer 66 of silicon dioxide and a layer 68 of silicon nitride of about 80 nm resulting in the structure shown in FIG. 8.

Figure 9:
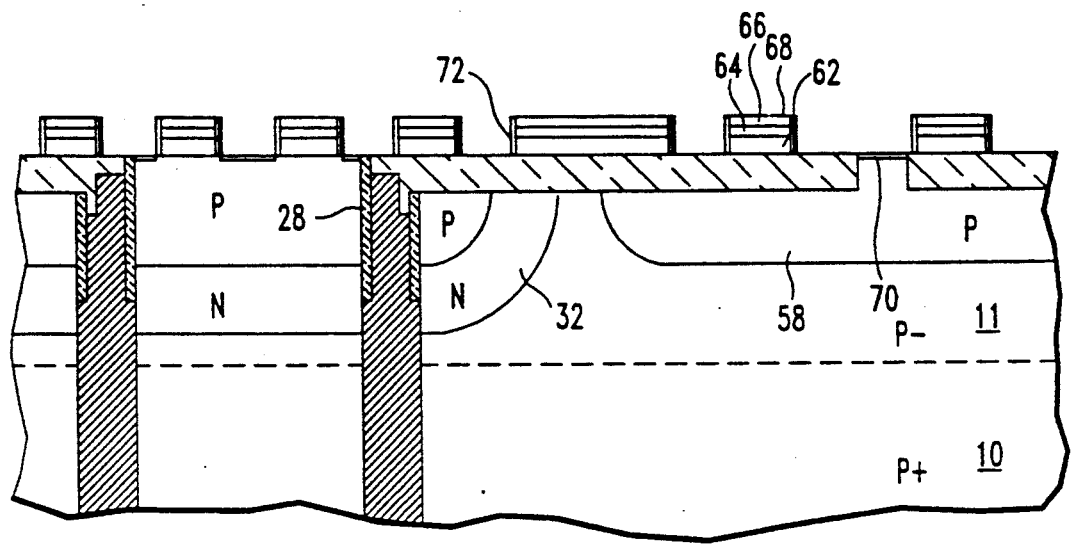

As shown in FIG. 9, the multilayered gate stack is selectively etched to define the first level of interconnect and the gate electrodes for the CMOS FET devices to be formed on the planarized substrate. The exposed polysilicon is oxidized slightly at about 1050 degrees C. Next, a blocking mask is used to protect all of the device regions except where N-channel FETs are to be formed. A lightly doped N-type region 70 is then formed by implanting phosphorus at about 30 KEV with a dose of about 1E14 atoms per square centimeter. After removal of the blocking mask, a sidewall spacer 72 is formed by depositing about 45 nm of CVD silicon nitride followed by an anisotropic RIE of nitride present on planar surfaces. Next, the doped regions are silicided in a conventional manner by evaporating about 20 nm of cobalt, annealing at about 750 degrees C. and removing unreacted cobalt in dilute nitric acid.

Figure 10:
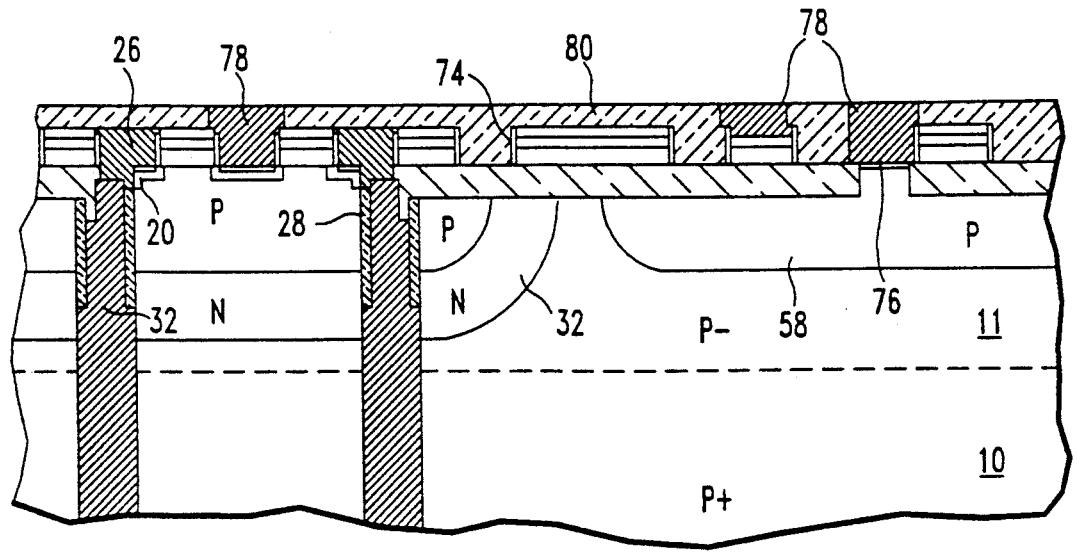

The devices and DRAM structure are completed with the following steps illustrated with reference to FIG. 10. A silicon nitride sidewall 74 is formed by depositing a layer of silicon nitride of about 15 nm followed by an anisotropic RIE step. The N+-type diffusions 76 for NFET devices are formed, after placing a blocking mask to protect PFET regions, by implanting arsenic at about 50 KEV with a dose of about 5E15 followed by a drive-in step in nitrogen at about 900 degrees C. The P+-type diffusions for PFET devices are formed, after placing a blocking mask to protect NFET regions, by implanting boron at about 10 KEV with a dose of about 5E15 atoms per square centimeter. A polysilicon surface strap 26 is formed to connect the N-type diffusions forming the storage node region 20 to the polysilicon 55' at the tops of the deep trenches is formed by the use of a blocking mask exposing the storage node regions, selectively etching the oxide at the trench top, depositing N-type polysilicon and planarizing by a chemical-mechanical polishing process to leave polysilicon straps 26. Interconnects 78 of titanium nitride and tungsten are formed as borderless contacts and an interlevel passivating layer 80 of phosphorus-doped glass is deposited and planarized, again by chemical-mechanical polishing techniques. The DRAM is completed by providing a number of additional planarized interconnect levels, as required by the complexity of the circuits to be interconnected.

While the invention has been described in terms of a single preferred embodiment, those skilled in the art will recognize that many of the steps described above can be altered and that dopant species and types as well as other material substitutions can be freely made without departing from the spirit and scope of the invention.

What is claimed is:

1. A dynamic random access memory device comprising:
- a semiconductor substrate having a first region of a first conductivity type;
- at least one array of dynamic memory cells, each cell comprising an access transistor coupled to a storage capacitor, the transistors of each memory cell being formed within a second region of said semiconductor substrate, each access transistor having a control electrode, a data line contact, a storage node, and a channel region;
- a plurality of signal storage capacitors formed in a plurality of trenches formed in said substrate, each capacitor including a signal storage node and a reference voltage node separated by a dielectric insulator, the reference node being connected to said substrate and the storage node of each capacitor being connected to a corresponding storage node of one of said access transistors;
- means for physically and electrically isolating all of the channel regions of said access transistors within said one array from said first region of said substrate, said means comprising a third region of opposite conductivity type to said first region, said third region formed between between said first and second regions, said third region intersecting all of said trenches; said third region comprising a doped well formed in said substrate wherein the doped well extends beyond and below said second region and having a depth within said substrate less than that of said trenches; and
- means for biasing said first, second and third regions of said substrate to first, second and third different reference voltages.

2. The dynamic random access memory device of claim 1 wherein the third region has an impurity doping level which varies with depth from the surface of the substrate.

3. The dynamic random access memory device of claim 2 wherein the impurity type of said first region is P-type.

4. The dynamic random access memory device of claim 3 wherein the dopant impurity of said first region is boron and the dopant impurity in said third region is N-type.

5. The dynamic random access memory device of claim 4 wherein the access transistors are N-channel FET devices.

* * * * *